United States Patent Office 3,565,707
Patented Feb. 23, 1971

3,565,707
METAL DISSOLUTION

Kenneth John Radimer, Little Falls, Frank Edward Caropreso, East Windsor, and Bernard James Hogya, Sayreville, N.J., assignors to FMC Corporation, New York, N.Y., a corporation of Delaware No Drawing. Continuation-in-part of application Ser. No. 529,643, Feb. 24, 1966. This application Mar. 3, 1969, Ser. No. 803,970
Int. Cl. C23f *1/00, 1/02*
U.S. Cl. 156—3 9 Claims

ABSTRACT OF THE DISCLOSURE

Process for dissolving certain metals, namely nickel, tin and alloys thereof, which are not etched by persulfate solutions alone, by treating them in an etchant containing 8 to 45% by weight of a persulfate and 0.2 to 40% of an acid which may be either fluosilicic, fluoboric or hydrofluoric acid.

CROSS-REFERENCE TO RELATED APPLICATIONS

This application is a continuation-in-part of U.S. application Ser. No. 529,643, filed on Feb. 24, 1966 in the name of the present inventors, now abandoned.

BACKGROUND OF THE INVENTION

(A) Field of the invention

This invention relates to the dissolution of certain metals using an aqueous etching solution of peroxydisulfates (also termed persulfates).

(B) Description of the prior art

Solutions of peroxygen chemicals, such as ammonium persulfates [$(NH_4)_2S_2O_8$], sodium persulfate ($Na_2S_2O_8$), or potassium persulfate ($K_2S_2O_8$), are commonly used to dissolve metallic copper. This is desirable, for example, in chemical machining operations in place of ordinary machining in order to remove specified amounts of copper from surfaces of fragile or peculiarly shaped objects. A more widespread application for dissolving copper is the etching of printing plates and electrical circuit boards. In this application a resist or mask in the form of a desired design is placed over the surface of a copper film laminated to a base, and the partially masked copper film is treated with the etchant. The copper area not covered by the resist is dissolved, while the copper covered by the resist remains to form the desired design or circuits. Aqueous persulfate solutions are desired in such applications because, unlike other common etchants, they do not generate obnoxious fumes, are easily handled and are clean working.

In an effort to improve the physical properties of metal workpieces and circuit boards, manufacturers have replaced the copper therein with copper alloys or other metals. One difficulty in producing these improved workpieces or circuit boards is that conventional persulfate solutions either do not dissolve many of these copper substitutes at all or dissolve them at such a low rate that the use of conventional persulfate solutions is not commercially feasible.

A second approach to improving the physical properties of these metal workpieces or circuit boards has been to construct the metal components thereof of two or more different metals superimposed or laminated one over the other, e.g., a copper underlayer upon which rests a tin or tin alloy overlayer.

Currently, bimetallic workpieces, e.g., electrical circuit boards, are produced by masking the surface of a copper film adhered to a nonmetallic base and electroplating an overlayer metal, e.g., tin or tin alloy, directly onto the copper film through openings in the mask to form a desired electrical circuit. The plating mask is then removed. The copper film not covered by the overlayer metal circuit is then dissolved away with a conventional persulfate etching solution. The result is a circuit board made up of a nonconductive base to which is bonded an etched copper circuit, overlayed with an electroplated overlayer metal, e.g., tin or tin alloy.

This combined electroplating and etching technique is costly and requires skilled personnel to carry out the technically difficult operation of electroplating a metal or alloy overlayer in the form of conductive pattern. In spite of these serious drawbacks, manufacturers have utilized this combined electroplating-etching technique because it is not possible to use any present, known, etching solution to produce acceptable bimetallic electrical circuit boards by applying a resist pattern to an overlayer metal that completely covers an underlayer metal and then etching both metal layers in the exposed portions of the resist pattern. More specifically, some etchants, such as ferric chloride or cupric chloride, cannot etch both metals without undercutting the metal overlayer beneath the resist; other desirable etching solutions, such as conventional persulfate solutions, either cannot etch the overlay metal (or alloy) or etch them at such a low rate that they are commercially unacceptable.

As a result, there is a need for an etching solution that has all the desirable working properties of a conventional persulfate etchant and which can satisfactorily etch these improved workpieces (including circuit boards) containing metals or alloys not readily etched by aqueous solutions of persulfate alone.

OBJECTS OF THE INVENTION

It is an object of the present invention to provide a novel etching composition which can be used to dissolve certain metals and alloys not readily etched by aqueous solutions of persulfates alone, at commercially acceptable rates to yield workpieces having high quality, cleanly etched, uniform surfaces without ragged edges.

It is a further object to provide etching solutions which can etch multilayered, metal-laminated, circuit boards so as to yield electrical circuits having little undercutting of one or more of the metal layers used in the makeup of the circuit.

These and other objects will be apparent from the following disclosure.

SUMMARY OF THE INVENTION

We have now found that certain metals which are etched at low rates or not at all by solutions containing only persulfates, namely nickel, tin and alloys thereof (including certain tin-containing copper alloys), can be etched at commercially acceptable etching rates by means of an aqueous-based etching solution containing from 8 to 45% by weight of a persulfate and an acid selected from the group consisting of fluosilicic acid, fluoboric acid and hydrofluoric acid, said acid being present in amounts of from about 0.2 to 40% (and preferably about 0.2 to 10%) by weight; the above etching solutions containing either fluoboric acid or fluosilicic acid are especially useful in etching nickel and nickel alloys.

Further, we have found that the above etching solutions can be used to etch a resist-coated, multilayered, metal-laminated circuit board (preferably wherein copper constitutes the underlayer and either tin or a tin alloy constitutes an overlayer) so as to give a sharply-defined, etched circuit; the novel etching solutions can be used alone to etch through all of the metallic layers of the circuit board or they can be used to etch only through the overlayer metal, and a second etchant, a conventional, aqueous persulfate solution, can be used to etch any remaining underlayer metal or metals.

DESCRIPTION OF THE INVENTION AND THE PREFERRED EMBODIMENTS

In carrying out the present invention, an aqueous persulfate solution is made up containing about 8 to 45% by weight of a persulfate salt. It is preferred for present purposes to employ ammonium persulfate because of its high solubility in water, although other persulfate salts, such as potassium persulfate and sodium persulfate having the required solubility, can also be employed. The preferred persulfate solution contains about 10 to 25% by weight ammonium persulfate. To this solution is added from about 0.2 to about 40% by weight of either fluosilicic acid, hydrofluoric acid or fluoboric acid. A preferred amount is from about 0.2 to 10% by weight, since this has been found to give good etching and is more economical. If desired, mixtures of these added acids can also be employed with the solution of persulfate. A blank circuit board containing one or more layers of metal to be etched is then fitted with a resist pattern, and the unmasked portion is then contacted with the etching solution.

Among the metals which can be etched by the present etchant are those which are etched slowly or not at all by conventional, aqueous solutions containing only persulfate salts, namely, nickel and tin. Alloys which contain substantial amounts of these metals also may be etched, as can copper-tin alloys not normally etched by solutions of persulfates alone. Alloys of these metals, as used in this specification, refer to those alloys containing substantial amounts, e.g., at least about 5% by weight of the above metals. Alloys which can be etched at acceptable rates by the instant etching solutions include: phosphor bronze (95% Cu, 5% Sn), Invar (30% Ni, 63.8% Fe, 0.2%), Kovar (29% Ni, 17% Co, 54% Fe), and nickel silver (65% Cu, 18% Ni, 17% Zn).

In addition, certain of the present etching solutions have been found to be selective in attacking metals. For example, our persulfate etching solutions containing fluosilicic acid or fluoboric acid are suitable, especially for etching nickel and nickel alloys.

The etching can take place by either conventional immersion-etching or spray-etching. In the immersion-etching process the workpiece is merely immersed in the etching solution for the amount of time required to etch the exposed metal surface. In the spray-etching technique the etching solution is discharged from a spray nozzle under pressure, and the spray is allowed to impinge on the masked metal workpiece until etching is complete.

In practice, the spray-etching technique is normally preferred because it permits shorter etch times and results in a better quality etch. This is due, in large measure, to the constant replacement of etchant in contact with the workpiece and to the removal of a metal-rich layer of etchant in immediate contact with the workpiece. The temperature of etching is not critical, but temperatures of from about 20° to about 65° C. can be used. Elevated temperatures of from 35° to 55° C. are preferred because they increase the etching rate, thereby reducing the time required to carry out the etching.

When the present etching solution is used to etch circuit boards containing two metallic layers or laminates adhered to a base, the bimetallic, laminated board is first covered with an etching resist, and the board is then exposed to the etchant. The $H_2SiF_6$, HF or $HBF_4$—modified persulfate etchant attacks the exposed surface of the upper or overlayer metal (normally tin or a tin alloy) and etches down to the second or underlayer metal (normally copper). Surprisingly, the etching solution then etches the copper underlayer without any material undercutting of the overlayer metal beneath the resist. As a result, the single etchant solution etches both metal layers so as to form a uniform, sharply etched surface without materially undercutting either layer beneath the resist. It is believed that this etching action is unique among etchants because prior etching solutions, e.g., $FeCl_3$ or $CuCl_2$, cause objectionable undercutting of the tin or tin alloy overlayer.

In the above description of the invention, the bimetallic, laminated circuit board was etched only with the $H_2SiF_6$, HF or $HBF_4$—modified persulfate etching solution. It is also possible to obtain sharper etching by an alternate embodiment employing two etch baths—particularly when copper constitutes the underlayer and tin or a tin alloy constitutes the overlayer. In this alternate procedure the resist-fitted, bimetallic, laminated circuit board is first etched in an $H_2SiF_6$, HF or $HBF_4$—modified persulfate solution until the overlayer metal has been etched. The partially etched board is then removed from the first etching solution and is placed in a second, conventional persulfate etching solution, e.g., an aqueous ammonium persulfate solution of 8 to 45% by weight $(NH_4)_2S_2O_8$, and the remaining underlayer (preferably copper) is then etched.

The use of this dual etching system gives extremely fine etching and is useful where high resolution of lines is required. This is achieved because the first etchant, the $H_2SiF_6$, HF or $HBF_4$—modified persulfate etchant, attacks the overlayer cleanly without any runoff of the overlayer metal and without any undesirable residues remaining. The second etchant, the conventional persulfate etchant, then preferentially attacks the undnerlayer metal without any material attack of the overlayer metal. Since each etchant etches a separate metallic layer independent of the other, the resist design is etched most sharply without any undercutting. While this dual etching technique yields extremely high quality etching, it should be understood that the use of $H_2SiF_6$, HF or $HBF_4$—modified persulfate solutions as the sole etchant also yields commercially acceptable etched products, although not of as high quality as those obtained with the dual etching system.

In the above description of the invention, a bimetallic, laminated, circuit board was used to illustrate the present etching process with either a single, modified persulfate etchant, or with a dual etching system. However, it should be understood that the very same technique can be used to etch multilayered, metal-laminated, circuit boards. For example, if one wished to etch a circuit board made up of a nonmetallic base adhered to an underlayer of copper, which is covered by a second layer of tin-nickel and an overlayer of tin, the entire metal laminate, after applying a resist pattern, can be etched with any of the present $H_2SiF_6$, HF or $HBF_4$—modified persulfate solutions in one operation. Alternately, the tin overlayer and tin-nickel intermediate layer can be etched with any of the present $H_2SiF_6$, HF or $HBF_4$— modified persulfate solutions, and the copper underlayer can be etched with a conventional persulfate solution if an even higher quality etch is desired.

The use of the present modified persulfate etchants has distinct advantages in the production of multilayered, metal-laminated, circuit boards over the electroplating-etching system, previously described, used by prior workers. Initially, the printed circuit manufacturer who does the etching is freed from having to do any expensive electroplating. Instead, blank circuit boards can now be supplied to the printed circuit manufacturer with complete, laminated sheets of the metals desired in the electrical circuit. The manufacturer need only etch away the undesired portions of the multilayered, metal-laminated sheet to form the electrical circuit of the existing metals in the laminate.

Another important advantage is that the multilayered, metal-laminated, circuit boards retain a resist that covers the overlayer metal of the electrical circuit during the etching step and subsequent thereto. The resist prevents the overlayer metal from being exposed to the etchant or from becoming dirty or losing its brightness due to oxidation during storage or in transit to the electronics manufacturer. The resist can easily be removed with acetone or other such solvent just prior to installation. This is not possible with the existing electroplating-etching system wherein an overlayer metal, in a circuit pattern desired, is electroplated directly onto a copper underlayer and the exposed copper (not covered by the overlayer metal) is etched with a conventional persulfate solution. In this latter electroplating-etching system, the overlayer metal acts as the resist, per se, during the subsequent persulfate etch and therefore is exposed to the etchant. As a result, a post-cleaning and brightening step is required.

The present persulfate etching solutions containing $H_2SiF_6$, HF or $HBF_4$ can be used with conventional additives used in the etching art; the same is true of persulfate solutions used as the second etchant of a dual etching system as defined above. For example, the use of minor amounts of sulfuric acid or phosphoric acid, e.g., 1 to 3% by weight, in the second persulfate etchant of a dual etchant system, and/or the addition of mercury (or other metals more noble than the metal being etched in the system) in order to increase the etch rate in any of the instant modified persulfate etchants or the second etchant of the above dual etchant system, is within the purview of the present invention.

The following examples are given to illustrate the present invention and are not deemed to be limiting thereof.

Example 1

A blank, copper-laminated, circuit board containing 2 ounces of copper per square foot was plated overall with a tin-nickel alloy containing 65% tin and 35% nickel until a 0.5 mil layer of the alloy was deposited. A resist pattern of the desired electric circuit was placed over the tin-nickel alloy depositing a Dynachem Photo Resist (DCR). The board was then immersed in a modified persulfate etching solution maintained at 38° C. until the unmasked portion of the tin-nickel alloy was completely etched. The modified persulfate solution contained:

20 weight percent ammonium persulfate.
5 p.p.m. dissolved mercury
5 volume percent 48% HF solution
(2.5% by weight of HF)

The partially-etched, resist-coated board was then immersed in a second etching bath maintained at 38° C. and maintained in the bath until all of the unmasked copper was dissolved. The time required for complete etching is set forth in Table I.

The second etching bath was a standard ammonium persulfate etchant containing dissolved mercury as an activator. The second bath was made up of:

20 weight percent ammonium persulfate
5 p.p.m. dissolved mercury
1.5 volume percent concentrated $H_2SO_4$ The etched circuit board was then water-rinsed to remove adhering etching solution and blown dry with air. The DCR resist was then removed with acetone. The resulting circuit board, which contained an electrical circuit whose underlayer comprised copper and whose overlayer comprised the tin-nickel alloy, was examined for its appearance and sharpness of etch. These are reported in Table I.

Example 2

A blank, copper-laminated, circuit board of the same type as in Example 1 was coated overall with a 60–40 solder alloy (60% Sn, 40% Pb) until a 2.0 mil layer of the solder was deposited. A Dynachem Photo Resist (DCR) pattern of a desired electrical circuit was then placed over the solder and the board immersed in a modified, persulfate etching solution maintained at 25° C. until the unmasked portion of the solder alloy was completely etched. The modified persulfate solution contained:

20 weight percent ammonium persulfate
5 p.p.m. dissolved mercury
9 volume percent 48% by weight HF solution
(4.5% by weight of HF)

The partially-etched, resist-coated board was then immersed in a second etching bath maintained at 25° C. until all of the unmasked copper was dissolved. The time required for complete etching is set forth in Table I.

The second etching bath was a standard ammonium persulfate etchant identical to that set forth in Example 1. The etched circuit board was then removed, rinsed, dried and the DCR resist removed in the same manner as set forth in Example 1. The resulting circuit board, which contained an electric circuit made up of an underlay of copper and an overlay of solder, was examined for its appearance and sharpness of etch. The above procedure was repeated except that the etchants were maintained at 38° C. The results are set forth in Table I.

Example 3

A blank, copper-laminated board identical to that set forth in Example 1 was plated overall with tin until a 0.3 mil layer of tin was deposited. This board was etched in the same manner and with identical solutions set forth in Example 1. The time required for complete etching as well as the sharpness of etch and appearance of the final board is reported in Table I.

A second board was treated exactly as set forth above except that the two etchants were maintained at 25° C. during the etching period. The results also are set forth in Table I.

TABLE I

| | At 25° C. | | At 38° C. | |
|---|---|---|---|---|
| | Etch time, min.[1] | Etched board appearance[2] | Etch time, min.[1] | Etched board appearance[2] |
| Example 1: Overlayer, 65% Sn, 35% Ni; underlayer, Cu | ---------- | ---------- | 12.5 | S |
| Example 2: Overlayer, 60% Sn, 40% Pb; underlayer, Cu. | 9.25 | S | 9.0 | S |
| Example 3: Overlayer, Sn; underlayer, Cu. | 8.0 | S | 6.25 | S |

[1] Complete etching time.
[2] S=Satisfactory, i.e., completely etched, minimum raggedness, overall general appearance excellent.

Example 4

Blank, copper-laminated, circuit boards containing 2 ounces of copper per square foot were plated overall with a 65% tin-35% nickel alloy, until a 0.5 mil layer of the alloy was deposited. The same procedure was repeated on other boards until a 2.0 mil layer of a 60% tin-40% lead alloy (solder), and a 0.3 mil layer of tin, respectively, were deposited on separate boards. A Dynachem Photo Resist (DCR) pattern of a desired electrical circuit was then placed over the deposited overlayer. The masked boards were then immersed in a modified, persulfate etching solution at 25° C. until both the tin-alloy or tin overlayer and copper underlayer were completely etched. Duplicate runs were also carried out in which the etchant was maintained at 38° C. The modified persulfate solution contained 20 weight percent ammonium persulfate, 5 p.p.m. dissolved mercury and either HF or $HBF_4$ in the amounts specified in Table II. The etched circuit boards were then water rinsed, and blown dry with air. The DCR resist was removed with acetone and the appearance of the board examined. The rate of etch and the appearance of the boards are set forth in Table II.

TABLE II

| | Sn/Ni alloy overlayer on copper | | | | 60/40 solder overlayer on copper | | | | Tin overlayer on copper | | | |
|---|---|---|---|---|---|---|---|---|---|---|---|---|
| | Etch rate (mils/min.) | | Etched conductor appearance | | Etch rate (mils/min.) | | Etched conductor appearance | | Etch rate (mils/min.) | | Etched conductor appearance | |
| | 25° C. | 38° C. | 25° C. | 38° C. | 25° C. | 38° C. | 25° C. | 38° C. | 25° C. | 38° C. | 25° C. | 38° C. |
| Etchant solution additive[1]: | | | | | | | | | | | | |
| 1% HF | | | | | | | | | 0.43 | 0.40 | S | S |
| 3% HF | | | | | 0.46 | 0.68 | S | S | 1.00 | 1.00 | S | S |
| 5% HF | | 0.06 | | S | 0.74 | 0.87 | S | S | 1.00 | 1.20 | S | S |
| 7% HF | | 0.09 | | S | 0.87 | 0.87 | S | S | 1.00 | 1.20 | S | S |
| 9% HF | .06 | 0.11 | S | S | 1.00 | 1.00 | S | S | 1.20 | 1.50 | S | S |
| 9% $HBF_4$ | | | | | | 0.05 | | S | 0.43 | 0.40 | S | S |

[1] Volume percents added of concentrated 48% by weight solutions of the additive.
NOTE.—S=Satisfactory, i.e., completely etched, minimum raggedness, overall general appearance excellent.

EXAMPLE 5

The etching rates of the various metals and alloys identified in Table IV were determined in the etching solutions identified in Table III. The etch rates were determined by immersing foils of the various metals and alloys into the etchant for a period of 10 minutes at 38° C. The bath was agitated by flowing air through a fritted glass sparger at 500 ml./min. The thickness of the metal foils was measured before and after etching with a micrometer caliper. The resulting etching rates are reported in Table IV.

TABLE III

| | $(NH_4)_2S_2O_8$, g./l. | Added acid | Weight percent | Hg as $HgCl_2$ p.p.m. |
|---|---|---|---|---|
| Etchant number: | | | | |
| 1 | 220 | 9 vol. percent of 30% by wt. fluosilicic. | 3.1 | |
| 2 | 220 | 9 vol. percent of 48% by wt. hydrofluoric. | 4.5 | |
| 3 | 220 | 9 vol. percent of 48% by wt. fluoboric. | 5.3 | 5 |
| 4 | 220 | 9 vol. percent of 48% by wt. fluoboric. | 5.3 | |
| 5 | 220 | None | | |

TABLE IV
[Etch rate (mils/min.)]

| | Solution | | | | |
|---|---|---|---|---|---|
| Metal | No. 1 | No. 2 | No. 3 | No. 4 | No. 5 |
| Bronze, phosphor (A) (95 Cu, 5 Sn). | .30 | .34 | .28 | .30 | .00 |
| Copper | .19 | .18 | .24 | .15 | .15 |
| Invar (36 Ni, 63.8 Fe, 0.2 C) | .32 | .60 | .38 | .28 | .13 |
| Kovar (29 Ni, 17 Co, 54 Fe) | .30 | .30 | .30 | .30 | .15 |
| Nickel | .03 | .00 | .08 | .03 | .02 |
| Nickel silver (A) (65 Cu, 18 Ni, 17 Zn) | .18 | .20 | .25 | .17 | .06 |
| Tin | 1.00 | .70 | 1.30 | 1.30 | .00 |

Pursuant to the requirements of the patent statutes, the principle of this invention has been explained and exemplified in a manner so that it can be readily practiced by those skilled in the art, such exemplification including what is considered to represent the best embodiment of the invention. However, it should be clearly understood that, within the scope of the appended claims, the invention may be practiced by those skilled in the art, and having the benefit of this disclosure otherwise than as specifically described and exemplified herein.

What is claimed is:

1. In the process of etching metals selected from the group consisting of nickel, tin, nickel alloys, and tin alloys with an aqueous etching solution containing from 8 to 45% by weight of a persulfate, at a temperature of from 20 to 55° C., the improvement which comprises etching tin and tin alloys with said aqueous etching solution to which has been added from 0.2 to 40% by weight of an acid selected from the group consisting of fluosilicic, fluoboric and hydrofluoric, and etching nickel and nickel alloys with said aqueous etching solution to which has been added from 0.2 to 40% by weight of an acid selected from the group consisting of fluosilicic and fluoboric.

2. Process of claim 1 wherein said metals are selected from the group consisting of tin and alloys containing said metal, and said acid is hydrofluoric acid.

3. Process of claim 1 wherein said metal is in the form of a thin sheet having one side adhered to a nonmetallic base while the other side of said metal is coated with a resist, and portions of said metal not covered by said resist are etched by said etching solution whereby said nonmetallic base and said remaining metal adhered thereto to form an electrical circuit board.

4. Process of etching circuit boards composed of a nonmetallic base, a metal underlayer in contact with said base, at least one metal overlayer in contact with said metal underlayer and a resist in contact with the outermost metal overlayer that defines a desired electrical circuit, wherein, at least one of the metal layers is selected from the group consisting of nickel, tin, and alloys thereof, which comprises contacting said circuit board with an aqueous etching solution consisting essentially of from 8 to 45% by weight of persulfate, to which has been added an acid selected from the group consisting of fluosilicic, fluoboric and hydrofluoric acid when said metal is tin and tin alloys, and to which has been added an acid selected from the group consisting of fluosilicic and fluoroboric when said metal is nickel and nickel alloys, said acids being present in total amounts of from 0.2 to 40% by weight, maintaining said board in contact with said etching solution, and recovering a circuit board composed of a nonmetallic base, a metal underlayer and at least one metal overlayer thereon, said metal underlayer and any of said metal overlayers defining an electrical circuit.

5. Process of claim 4 wherein said metal underlayer is copper and said metal overlayer is selected from the group consisting of nickel, tin, and alloys thereof, and said acid is fluosilicic acid.

6. Process of claim 4 wherein said metal underlayer is copper and said metal overlayer is selected from the group consisting of nickel, tin, and alloys thereof, and said acid is fluoboric acid.

7. Process of claim 4 wherein said metal underlayer is copper and said metal overlayer is selected from the group consisting of tin and alloys thereof, and said acid is hydrofluoric acid.

8. Process of claim 4 wherein said circuit board is maintained in contact with the resulting acid modified etching solution until said metal overlayer has been etched, said circuit board is removed from contact with the resulting acid modified etching solution and placed in a second etchant consisting essentially of 8 to 45% by weight of a persulfate dissolved in water, said underlayer metal exposed by said resist is etched in said second etchant, and there is recovered a circuit board composed of a non-metallic base, a metal underlayer and a metal overlayer thereon, said metal underlayer and said metal overlayer defining an electrical circuit.

9. Process of claim 4 wherein said etching is conducted at a temperature of from 20° to 55° C., said persulfate is ammonium persulfate and said acid is present in amounts of from 0.2 to 10% by weight.

References Cited

UNITED STATES PATENTS

| | | | |
|---|---|---|---|
| 2,942,954 | 6/1960 | Thomas | 156—18 |
| 3,125,474 | 3/1964 | Watkins et al. | 156—18 |
| 3,181,984 | 5/1965 | Tillis | 156—20 |

JACOB H. STEINBERY, Primary Examiner

U.S. Cl. X.R.

156—18; 252—79.3